United States Patent
Fukuda

(10) Patent No.: US 8,350,281 B2
(45) Date of Patent: Jan. 8, 2013

(54) DISPLAY DEVICE, DISPLAY APPARATUS AND METHOD OF ADJUSTING A COLOR SHIFT OF WHITE LIGHT IN SAME

(75) Inventor: Toshihiro Fukuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 180 days.

(21) Appl. No.: 12/795,320

(22) Filed: Jun. 7, 2010

(65) Prior Publication Data

US 2010/0314638 A1  Dec. 16, 2010

(30) Foreign Application Priority Data

Jun. 15, 2009  (JP) ................ P2009-142046

(51) Int. Cl.
*H01L 33/00*  (2010.01)
(52) U.S. Cl. ............ 257/98; 257/89; 257/E33.067
(58) Field of Classification Search ............ 257/89, 257/98, E33.067
See application file for complete search history.

(56) References Cited

U.S. PATENT DOCUMENTS

2007/0069996 A1*  3/2007  Kuba et al. ............ 345/76

FOREIGN PATENT DOCUMENTS

| JP | 2002-367770 | 12/2002 |
| JP | 3508741 | 1/2004 |
| JP | 2005-094130 | 10/2005 |
| JP | 2007-134345 | 5/2007 |
| JP | 2007-234253 | 9/2007 |
| JP | 2007-294421 | 11/2007 |
| JP | 2007-299729 | 11/2007 |
| JP | 2008-140714 | 6/2008 |
| JP | 2008-523551 | 7/2008 |
| JP | 2008-524819 | 7/2008 |

OTHER PUBLICATIONS

Japanese Office Action dated Aug. 28, 2012 for corresponding Application No. 2009-142046.

* cited by examiner

Primary Examiner — Tan N Tran
(74) Attorney, Agent, or Firm — K&L Gates LLP

(57) ABSTRACT

A display device includes: an optical cavity portion; and a light emitting layer, wherein a peak wavelength of an internal emission spectrum of the light emitting layer is identical to a peak wavelength of a multiple interference filter spectrum of the optical cavity portion, and wherein a color shift Δ uv of white light in the display device at a viewing angle of 60° is less than or equal to 0.015. A method of adjusting a color shift of white light in a display device includes: setting a peak wavelength of a multiple interference filter spectrum obtained by an optical cavity portion in the display device equal to a peak wavelength of an internal emission spectrum of a light emitting layer in the display device; and adjusting a position of the light emitting layer in a thickness direction thereof.

22 Claims, 6 Drawing Sheets

DISPLAY DEVICE, DISPLAY APPARATUS AND METHOD OF ADJUSTING A COLOR SHIFT OF WHITE LIGHT IN SAME

CROSS REFERENCES TO RELATED APPLICATIONS

The present application claims priority to Japanese Priority Patent Application JP 2009-142046 filed in the Japan Patent Office on Jun. 15, 2009, the entire contents of which is hereby incorporated by reference.

BACKGROUND

The present application relates to a display device, a display apparatus, and method of adjusting a color shift of white light in same. More particularly, the present application relates to a display device such as an organic EL device having an optical cavity structure and a display apparatus such as an organic EL display using the display device.

In recent years, an organic EL display using organic EL (Electro Luminescence) devices has been noted as one of the display apparatuses that is replacing liquid crystal displays. The organic EL display is a spontaneous emission-type display where an organic material itself emits light when current flows therethrough. Therefore, the organic EL display has excellent characteristics in that it is not necessary to have a backlight and exhibits excellent color reproduction properties, high contrast, fast response properties appropriate for moving pictures, and a wide viewing angle.

An organic EL device used in the organic EL display has a structure in which an organic layer is disposed between an anode and a cathode, holes are injected from the anode to the organic layer and electrons are injected from the cathode to the organic layer, whereby light is emitted from a portion where hole-electron recombination takes place. The organic layer has a stacked structure, for example, including a light emitting layer in the portion where hole-electron recombination takes place, a hole transport layer provided for accepting and transporting holes from the anode to the light emitting layer, an electron transport layer provided for accepting and transporting electrons from the cathode to the light emitting layer, and the like.

In the field of the organic EL display, a display is in practical use in which the organic layer and one of the anode and cathode, and the like form a cavity structure, thus improving optical output power, reducing power consumption, raising color purity with the use of a multiple interference filter, and widening a color-reproduction range. Examples of such an organic EL display are disclosed in JP-A-2007-294421, JP-A-2007-134345, JP-A-2008-524819, and JP-A-2008-523551, for example.

The organic EL display having a cavity structure is able to raise color purity and widen a color-reproduction range since it is possible to extract light whose peak spectral intensity is high and whose width is narrow. On the other hand, in the organic EL display having a cavity structure, when the peak spectral width of the extracted light is narrowed, viewing-angle dependency increases. For example, when an emission surface is viewed from an oblique direction, the wavelength of light shifts greatly and the emission intensity decreases.

To improve the viewing-angle dependency, JP-A-2008-140714, for example, discloses a technique of providing an interference cancellation layer which is thicker than the principal emission wavelength of the light emitting layer and has a non-uniform thickness and which is capable of canceling possible optical interference between an optically transparent reflective electrode and a reflective layer. Moreover, WO2005/094130, for example, discloses a technique of forming a layer having light-scattering and light-reflecting properties so as to reduce angle dependency of emission luminance and emission colors.

Furthermore, JP-B-3508741, for example, discloses a technique of improving a white viewing angle when multiple interference effect is used. According to this technique, by shifting the peak wavelength of an internal emission spectrum relative to the peak wavelength of a multiple interference filter spectrum, the viewing-angle dependency of white which is very easily perceived visually is suppressed to an acceptable level that does not cause any problem in practical use.

SUMMARY

However, in the technique disclosed in JP-B-3508741, since the peak wavelength of the internal emission spectrum is shifted relative to the peak wavelength of the multiple interference filter spectrum by emphasizing the viewing-angle dependency of white, light extraction efficiency will be degraded. Although the technique disclosed in JP-B-3508741 is able to improve the viewing-angle dependency of white, the light extraction efficiency is degraded, thus increasing power consumption.

Therefore, it is desirable to provide a display device and a display apparatus which are capable of improving the viewing-angle dependency of white and providing excellent light extraction efficiency.

According to an embodiment, there is provided a display device including an optical cavity portion and a light emitting layer, in which a peak wavelength of an internal emission spectrum of the light emitting layer is identical to a peak wavelength of a multiple interference filter spectrum of the optical cavity portion, and a color shift $\Delta$ uv of white light in the display device at a viewing angle of 60° is less than or equal to 0.015.

According to an embodiment, there is provided a display device including an optical cavity portion and a light emitting layer, in which a peak wavelength of an internal emission spectrum of the light emitting layer is identical to a peak wavelength of a multiple interference filter spectrum of the optical cavity portion, and a color shift $\Delta$ uv of white light in the display device at a viewing angle of 60° is less than or equal to 0.015 based on a position of the light emitting layer in a thickness direction thereof.

According to an embodiment, there is provided a method of adjusting a color shift of white light in a display device including: setting a peak wavelength of a multiple interference filter spectrum obtained by an optical cavity portion in the display device equal to a peak wavelength of an internal emission spectrum of a light emitting layer in the display device; and adjusting a position of the light emitting layer in a thickness direction thereof.

According to an embodiment, there is provided a display apparatus including an optical cavity portion and a light emitting layer, in which a peak wavelength of an internal emission spectrum of the light emitting layer is identical to a peak wavelength of a multiple interference filter spectrum of the optical cavity portion, and a color shift $\Delta$ uv of white light in the display device at a viewing angle of 60° is less than or equal to 0.015.

According to an embodiment, there is provided a display apparatus including an optical cavity portion and a light emitting layer, in which a peak wavelength of an internal emission spectrum of the light emitting layer is identical to a peak wavelength of a multiple interference filter spectrum of the optical cavity portion, and a color shift Δ uv of white light in the display device at a viewing angle of 60° is less than or equal to 0.015 based on a position of the light emitting layer in a thickness direction thereof.

In an embodiment, the peak wavelength of the internal emission spectrum of the light emitting layer is made to be identical to the peak wavelength of the multiple interference filter spectrum obtained by the cavity portion so that the shape of the multiple interference filter spectrum obtained by the cavity portion is changed while maintaining the peak position. In this way, it is possible to suppress a decrease in the light extraction efficiency to a minimum level and to thus adjust the RGB balance of the luminance variation upon the existence of a viewing-angle dependency. Therefore, it is possible to improve the viewing-angle dependency of white and to provide excellent light extraction efficiency.

According to an embodiment, it is possible to improve the viewing-angle dependency of white and provide excellent light extraction efficiency.

Additional features and advantages are described herein, and will be apparent from the following Detailed Description and the figures.

DETAILED DESCRIPTION

Figure 1:
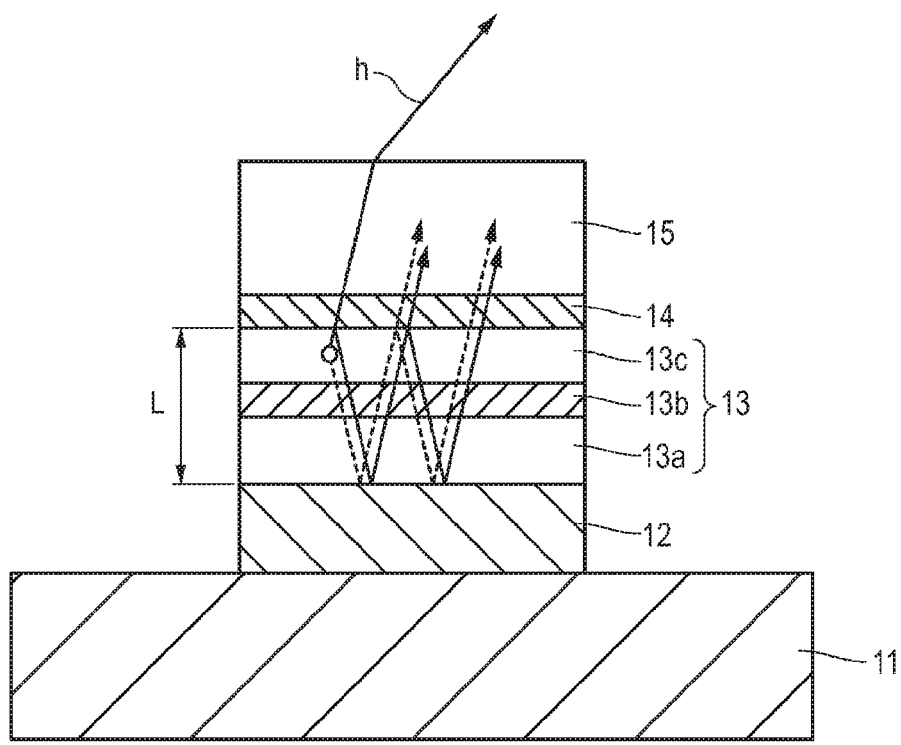
FIG. 1 is a main cross-sectional view showing an organic EL device according to a first embodiment.

The present application will be described with reference to the drawings according to an embodiment. The embodiments to be described hereinafter are specific examples of the present application, and various preferred technical limitations are imposed thereon. However, the scope of the present application is not limited to the embodiments unless there is any particular limitation in the following description. The description will be given in the following order, and throughout the entire drawings of the embodiments, the same reference numerals will be used for the same or similar parts:

1. First Embodiment (First Example of Organic EL Device);
2. Second Embodiment (Second Example of Organic EL Device);
3. Third Embodiment (Third Example of Organic EL Device);
4. Fourth Embodiment (Example of Display Apparatus using Organic EL Device); and
5. Other Embodiments (Modifications)

1. First Embodiment (Structure of Organic EL Device)

The structure of an organic EL device according to the first embodiment will be described. FIG. 1 shows the cross-sectional structure of the organic EL device. This organic EL device is a so-called top emission-type organic EL device, and has a structure in which a first electrode 12, an organic layer 13, a semitransparent reflection layer 14, and a second electrode 15 are sequentially stacked on a substrate 11. The organic layer 13 has a structure in which a buffer layer 13a, a hole transport layer 13b, and an organic light-emitting layer 13c also functioning as an electron transport layer are stacked in that order from the side of the substrate 11.

Although details are described later, the organic EL device has a cavity structure in which light emitted in the organic light-emitting layer 13c is resonated between the interface of the first electrode 12 and the organic layer 13 and the interface of the semitransparent reflection layer 14 and the organic layer 13, thus extracting light from the side of the second electrode 15.

Substrate

The substrate 11 is, for example, a transparent glass substrate, a semiconductor substrate, or the like, and may be flexible.

First Embodiment

The first electrode 12 is used as an anode electrode that also functions as a reflection layer. The first electrode 12 is made of a light reflective material such as platinum (Pt), gold (Au), chromium (Cr), tungsten (W), or the like. The first electrode 12 preferably has a thickness in the range from 100 nm to 300 nm.

Organic Layer

The organic layer 13 has a structure in which the buffer layer 13a, the hole transport layer 13b, and the organic light-emitting layer 13c also functioning as an electron transport layer are sequentially stacked from bottom. The electron transport layer may be provided as a separate layer different from the organic light-emitting layer 13c. The buffer layer 13a is a layer for preventing leakage. The buffer layer 13a may be made, for example, of m-MTDATA [4,4',4"-tris(3-methylphenylphenylamino)triphenylamine], 2-TNATA[4,4',4"-tris(2-naphtylphenylamino)triphenylamine], or the like.

The buffer layer 13a may be omitted if leakage is in an acceptable level. The hole transport layer 13b may be made, for example, of α-NPD[N,N'-di(1-naphthyl)-N,N'-diphenyl-[1,1'-biphenyl]-4,4'-diamine]. The organic light-emitting layer 13c may be made of different light emitting materials having emission colors of red (R), green (G), and blue (B). For example, as the light emitting material having the G emission color, Alq3 (tris-quinolinolaluminum complex) may be used.

These layers that form the organic layer 13 are preferably in specific thickness ranges, i.e. from 15 nm to 300 nm for the buffer layer 13a, from 15 nm to 100 nm for the hole transport layer 13b, and from 15 nm to 100 nm for the organic light-emitting layer 13c. However, the thicknesses of the organic layer 13 and the layers that form the same organic layer 13 are determined so that their optical film thicknesses have the values described later.

Semitransparent Reflection Layer

The semitransparent reflection layer 14 forms a cathode electrode. The semitransparent reflection layer 14 may be made, for example, of magnesium (Mg), silver (Ag), an alloy thereof, or the like. The semitransparent reflection layer 14 preferably has a thickness in the range from 5 nm to 50 nm.

Second Electrode

The second electrode 15 is made of a material that is typically used as a transparent electrode. Examples of such a material include indium tin oxide (ITO), an oxide of indium and zinc, and the like. The second electrode 15 has a thickness in the range from 30 nm to 1000 nm, for example.

A passivation film (not shown) made of a transparent dielectric material is provided on the second electrode 15. The transparent dielectric material preferably has a refractive index approximately equal to that of the material that forms the second electrode 15. As such a material, silicon oxide (SiO2), silicon nitride (SiN), or the like can be used. The passivation film may be formed to a thickness ranging from 500 nm to 10000 nm, for example.

Cavity Structure

In this organic EL device, the first electrode 12 made of a light reflective material, the organic layer 13, and the semitransparent reflection layer 14 forms a cavity structure and the organic layer 13 functions as a cavity portion.

It will be assumed that L is the optical distance between the first electrode 12 and the semitransparent reflection layer 14, i.e., the optical thickness of the cavity portion made up of the organic layer 13. It will be also assumed that Φ [radian] is the phase shift produced when light h generated in the organic light-emitting layer 13c is reflected at the first electrode 12 and the semitransparent reflection layer 14. If it is also assumed that λ is the wavelength of the light h emitted in the organic light-emitting layer 13c, then, the phase delay δ of a single event of multiple interference can be expressed by Equation 1 below.

$$\delta = 2\pi \cdot 2L/\lambda + \Phi \quad \text{(Equation 1)}$$

The λ that satisfies Equation 2 below is the peak wavelength of a multiple-interference filter which is a narrow-band filter.

$$\delta = 2\pi \cdot m \text{ (where m is an integer)} \quad \text{(Equation 2)}$$

If it is assumed that λmax is the λ that satisfies Equation 2, Equation 3 below can be obtained from Equations 1 and 2. The optical distance L is determined so as to satisfy Equation 3.

$$2L/\lambda\max + \Phi/2\pi = m \quad \text{(Equation 3)}$$

Thicknesses of the respective layers that form the organic layer 13 are determined so as to satisfy Equation 3. The optical distance L of the cavity portion is calculated by Equation 4 below from the respective refractive indices n1, n2, . . . , and nk and respective thicknesses d1, d2, . . . , and dk of the respective layers of the organic layer 13 (specifically, the buffer layer 13a, hole transport layer 13b, and organic light-emitting layer 13c in the first embodiment).

$$L = n1 \cdot d1 + n2 \cdot d2 + \ldots + nk \cdot dk \quad \text{(Equation 4)}$$

One example of calculation of the optical distance L will be described. For example, an example of calculation of L when the organic layer 13 is configured as follows will be described.

Buffer layer 13a: made of 2-TNATA; thickness d1=32 nm; and refractive index n1=1.9

Hole transport layer 13b: made of α-NPD; thickness d2=30 nm; and refractive index n2=1.8

Organic light-emitting layer 13c: made of Alq3; thickness d3=50 nm; and refractive index n3=1.7

In this case, the optical distance L of the organic layer 13 will be calculated as L=1.9·32+1.8·30+1.7·50=200 nm.

The phase shift Φ produced when light h generated in the organic light-emitting layer 13c is reflected at the first electrode 12 and the semitransparent reflection layer 14 is derived in the following manner. That is, a reflection layer (Cr or the like) or a semitransparent reflection layer (Mg, Ag, Mg—Ag alloy, or the like) is first formed on a substrate (for example, Si substrate) to a thickness of 200 nm more. Then, using a spectroscopic ellipsometer (for example, a product of SOPRA), the refractive index n and absorption coefficient k of the reflection layer or semitransparent reflection layer are determined.

The phase shift on the side of the reflection layer can be calculated from its n and k, and the refractive index n of the organic layer in contact with the reflection layer (see, for example, Principles of Optics, Max Born and Emil Wolf, 1974 (PERGAMON PRESS)).

The phase shift on the side of the semitransparent reflection layer can be similarly calculated from its n and k, as well as the refractive index n of the organic layer in contact with the semitransparent reflection layer, the thickness of the semitransparent reflection layer, and the refractive indices and thicknesses of the respective transparent films disposed thereabove. Also the refractive indices of the organic layer and respective transparent films can be measured using a spectroscopic ellipsometer.

The sum of the two phase shift amounts is Φ. As an exemplary value of Φ, Φ=−4.7 [radian] when λ=535 nm.

Feature of Organic EL Device

In the organic EL device according to the first embodiment, the peak wavelength of the internal emission spectrum of the light emitting layer is made to be identical to the peak wavelength of the multiple interference filter spectrum obtained by the cavity portion. The color shift Δuv of white at a viewing angle of 60° is held to be equal to or smaller than 0.015 by changing the shape of the multiple interference filter spectrum obtained by the cavity portion while maintaining a peak position thereof. The internal emission spectrum of the light emitting layer is the spectrum of light which is emitted in the light emitting layer and extracted without undergoing multiple interference.

In the organic EL device, the upper limit 0.015 of the color shift Δuv of white has the following technical significance. In the fields of TV monitors and displays such as projectors where the color-reproduction range is emphasized, it is necessary to suppress the variation of white to a range of 3 and 5 JND. This range corresponds to a range of 0.011 and 0.019 in units of uv, and the central value is 0.015. Therefore, the value 0.015 is considered as an allowable limit of the human perception for the color shift.

The features of the organic EL device according to the first embodiment will be described by way of Specific Examples 1 to 3. Here, Specific Example 3 corresponds to an embodiment of the present application, and Specific Examples 1 and 2 are Comparative Examples exemplified to facilitate understanding of the present application.

Specific Example 1

Figure 2:
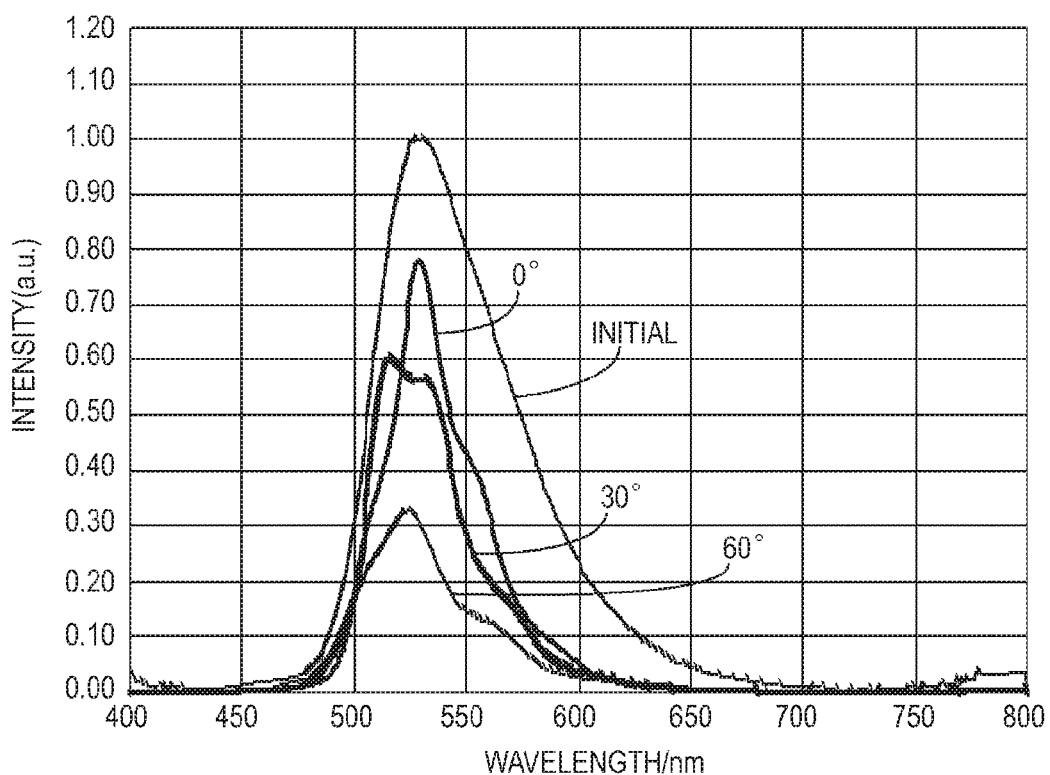
FIG. 2 is a schematic diagram showing the viewing-angle dependencies of the organic EL device according to the first embodiment and an organic EL device (G emission) of Comparative Example.

FIG. 2 shows a calculation example of the viewing-angle dependency of the spectrum of light extracted from green light emission when the peak wavelength of the internal emission spectrum is made to be identical to the peak wavelength of the multiple interference filter spectrum obtained by the cavity portion. In this example, m=1 in Equation 3. This example is the case where the light extraction efficiency is maximized.

In FIG. 2, the emission spectrum denoted by "Initial" is the internal emission spectrum. The emission spectrum denoted by "0°" is the spectrum of extracted light at a viewing angle of 0°, the spectrum being obtained by multiplying the internal emission spectrum with the multiple interference filter spectrum obtained by the cavity portion. The emission spectrum denoted by "30°" is the spectrum of extracted light at a viewing angle of 30°, the spectrum being obtained by multiplying the internal emission spectrum with the multiple interference filter spectrum obtained by the cavity portion. The emission spectrum denoted by "60°" is the spectrum of extracted light at a viewing angle of 60°, the spectrum being obtained by multiplying the internal emission spectrum with the multiple interference filter spectrum obtained by the cavity portion. The same notation is applied to FIGS. 3 and 4.

As will be understood from FIG. 2, in Specific Example 1, as the viewing angle increases, the peak of the spectrum of the extracted light shifts toward shorter wavelengths, and the peak intensity also decreases.

Specific Example 2

Figure 3:
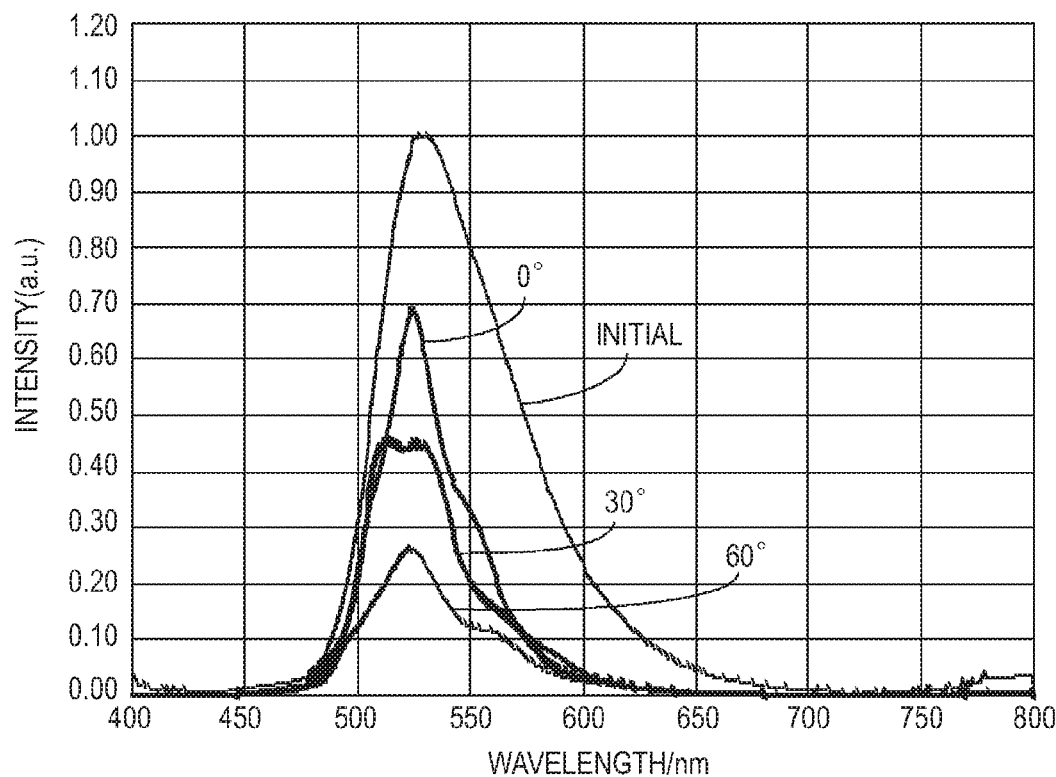
FIG. 3 is a schematic diagram showing the viewing-angle dependencies of the organic EL device according to the first embodiment and the organic EL device of Comparative Example.

FIG. 3 shows a calculation example of the viewing-angle dependency of the spectrum of light extracted from green light emission when the peak wavelength of the multiple interference filter spectrum obtained by the cavity portion is shifted toward shorter wavelengths by 10 nm from the peak wavelength of the internal emission spectrum. In this example, m=1 in Equation 3.

In Specific Example 2, by selecting an optical distance L different from the optical distance L of the cavity portion in Specific Example 1 as the optical distance L of the cavity portion, the peak wavelength of the multiple interference filter spectrum is shifted towards the shorter wavelengths by 10 nm from the peak wavelength of the internal emission spectrum.

As will be understood from FIG. 3, in this example, the spectrum of the extracted light is shifted further towards the shorter wavelengths and the peak intensity is also decreased further when compared to Specific Example 1.

Specific Example 3

Figure 4:
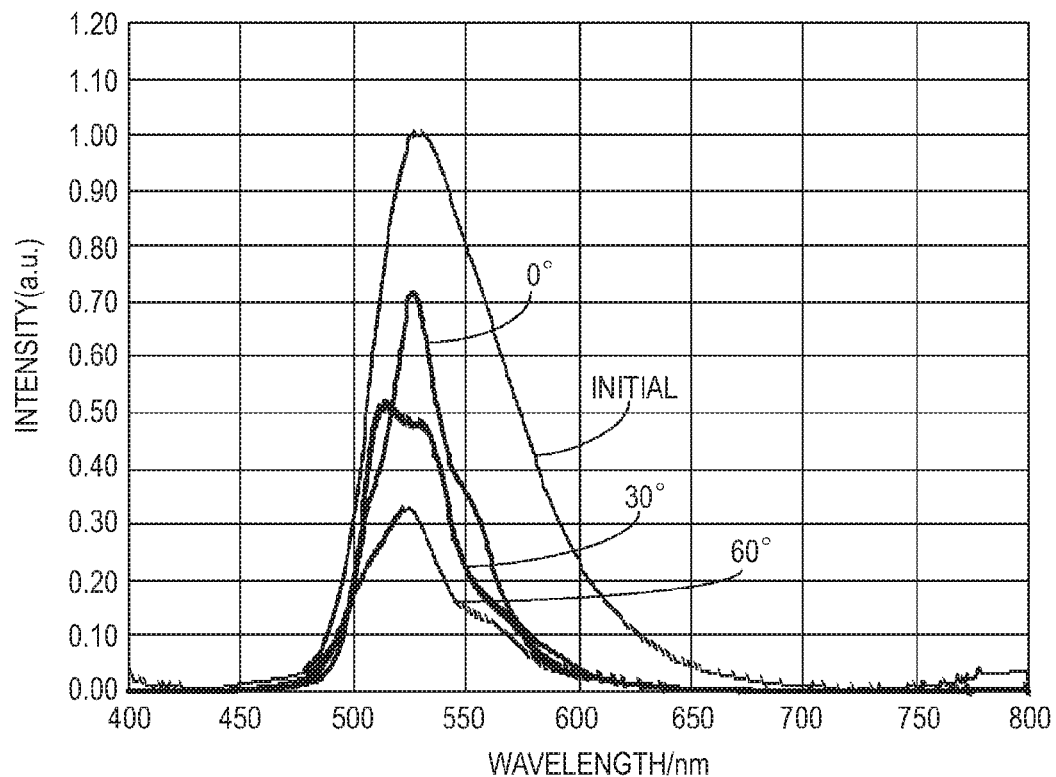
FIG. 4 is a schematic diagram showing the viewing-angle dependency of the organic EL device (G emission) according to the first embodiment.

FIG. 4 shows a calculation example of the viewing-angle dependency of the spectrum of light extracted from green light emission when the position of the light emitting layer 13c is shifted in a state where the peak wavelength of the internal emission spectrum is made to be identical to the peak wavelength of the multiple interference filter spectrum obtained by the cavity portion. In this example, m=1 in Equation 3. In Specific Example 3, the position of the light emitting layer 13c is shifted in a thickness direction thereof so that the shape of the multiple interference filter spectrum obtained by the cavity portion is changed while maintaining a peak position thereof.

In Specific Example 3, by shifting the position of the light emitting layer 13c in the thickness direction (towards the side of the substrate 11 or the side opposite to the substrate 11), the amount of luminance drop at a viewing angle of 60° relative to the luminance at a viewing angle of 0° is held to be equal to that in Specific Example 2 (the luminance drop is specifically 40% as will be described later). At this time, the optical distance L of the cavity portion is maintained to be constant before and after the position of the light emitting layer 13c is shifted.

As will be understood from FIG. 4, in Specific Example 3, the amount of peak intensity drop of the spectrum of the extracted light is smaller than that in Specific Example 2.

The calculated values of luminance variations in Specific Examples 1, 2, and 3 are shown in Table 1.

TABLE 1

| | Shift Amount of Peak Wavelength | Viewing Angle | | |
|---|---|---|---|---|
| | | 0° | 30° | 60° |
| Specific Example 1 | 0 nm | 1.0 (1.0) | 0.86 | 0.44 |
| Specific Example 2 | −10 nm | 1.0 (0.88) | 0.77 | 0.40 |
| Specific Example 3 | 0 nm | 1.0 (0.95) | 0.81 | 0.40 |

As shown in Table 1, in Specific Example 2, in order to maintain the luminance at a viewing angle of 60° to be 40% of the luminance at a viewing angle of 0°, the peak wavelength of the multiple interference filter spectrum is shifted towards the shorter wavelengths by 10 nm from the peak wavelength of the internal emission spectrum. In Specific Example 2, the luminance at the viewing angle of 0° is decreased by 12% with respect to the luminance at the viewing angle of 0° in Specific Example 1 where the shift amount of the peak wavelength is 0 nm.

On the other hand, as shown in Table 1, in Specific Example 3, by shifting the position of the light emitting layer 13c in the thickness direction, the luminance at the viewing angle of 60° is controlled to be 40% of the luminance at the viewing angle of 0°. In this case, in Specific Example 3, the luminance drop relative to the luminance at the viewing angle 0° in Specific Example 1 can be suppressed to 5%. That is to say, in Specific Example 3, by slightly decreasing the peak intensity, it is possible to control the luminance variation at large viewing angles.

On the other hand, the chromaticity value of white is determined when the chromaticity values of the monochromatic colors R, G, and B and the luminance balance (white balance) values are given. That is, it will be assumed that the chromaticity values of the monochromatic colors R, G, and B are (xr, yr) for R, (xg, yg) for G, and (xb, yb) for B, and the corresponding luminance balance (white balance)values are Yr, Yg, and Yb (where yr+Yg+Yb=1).

In this case, the chromaticity value (xw, yw) of white can be calculated from xw=xw'/(xw'+1+zw') and yw=1/(xw'+1+zw'). Here, xw'=xr×Yr/yr+xg×Yg/yg+xb×Yb/yb, and zw'= (1−xr−yr)×Yr/yr+(1−xg−yg)×Yg/yg+(1−xb−yb)×Yb/yb.

When the viewing angle changes, monochromatic chromaticity values (xr, yr), (xg, yg) and (xb, yb) are changed towards the shorter wavelengths, and the luminance varies as well. Therefore, the luminance balance (white balance) values Yr, Yg, and Yb also vary, and the chromaticity value of white is shifted according to the above-mentioned equations. Therefore, the color shift of white can be improved by changing the luminance variation under the existence of a viewing angle to adjust the amount of change in the luminance balance (white balance) values.

In the first embodiment, the peak wavelength of the internal emission spectrum is made to be identical to the peak wavelength of the multiple interference filter spectrum obtained by the cavity portion so that the shape of the multiple interference filter spectrum obtained by the cavity portion is changed while maintaining the peak position. In this way, by changing the luminance variation under the existence of a viewing angle to adjust the amount of change in the luminance balance (white balance) values while suppressing a loss of light flux by a multiple-interference filter to a minimum level, it is possible to decrease the viewing-angle dependency of the color shift of white.

Figure 5:
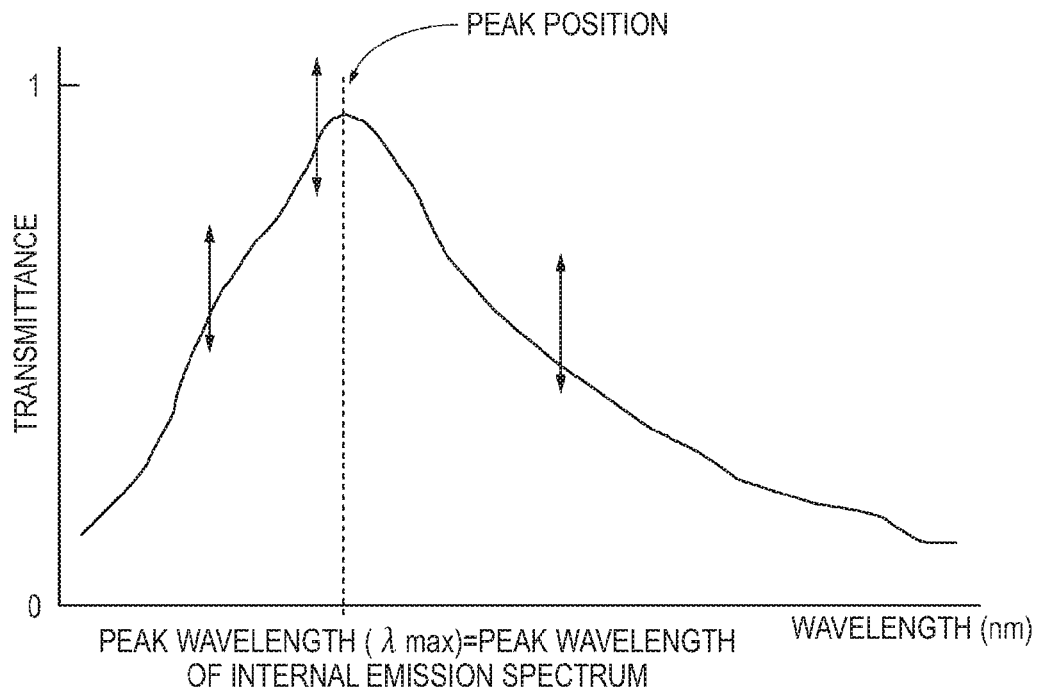
FIG. 5 is a conceptual diagram showing the multiple interference filter spectrum obtained by a cavity portion.

FIG. 5 is a conceptual diagram showing the multiple interference filter spectrum obtained by the cavity portion of the organic EL device according to the first embodiment. As shown in FIG. 5, in the organic EL device according to the first embodiment, the peak wavelength (λmax in Equation 3) of the multiple interference filter spectrum obtained by the cavity portion is made to be identical to the peak wavelength of the internal emission spectrum.

Moreover, the shape of the multiple interference filter spectrum obtained by the cavity portion is changed while maintaining the peak position. That is, in FIG. 5, the transmittance of the multiple interference filter spectrum is changed so that the maximum transmittance of the multiple interference filter spectrum obtained by the cavity portion would exist at the peak position denoted by the dotted line.

In this way, the color shift of white under the existence of a viewing angle is improved by changing the luminance variation under the existence of a viewing angle to adjust the amount of change in the luminance balance (white balance) values to thus suppress a loss of light flux by the multiple-interference filter to a minimum level. In the first embodiment, specifically, the color shift Δuv of white at a viewing angle of 60° is held to be equal to or smaller than 0.015.

Figure 6:
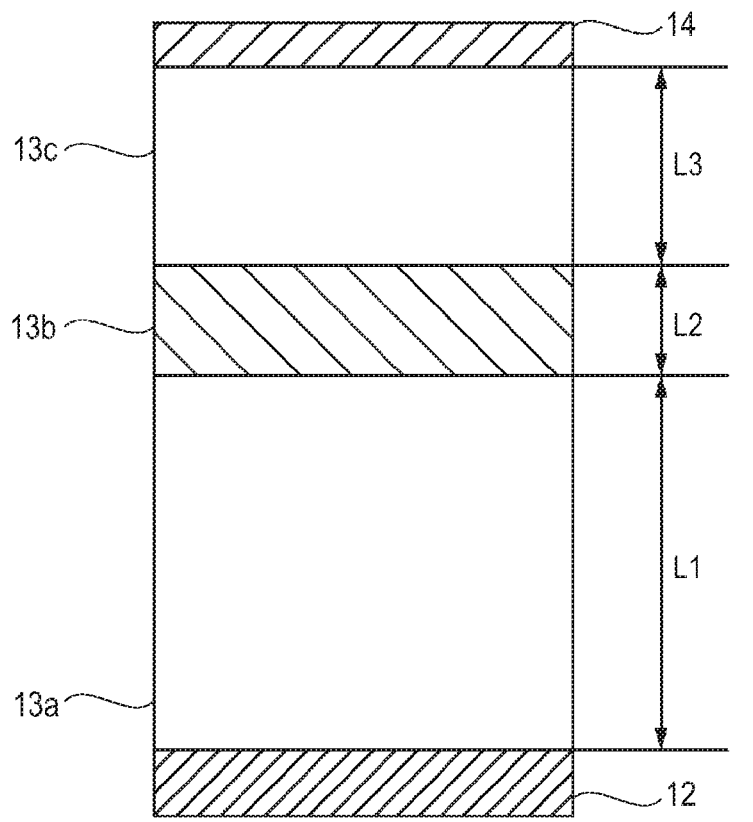
FIG. 6 is a cross-sectional view showing an exemplary structure of the cavity portion.

Exemplary configurations of the cavity structures of organic EL devices having respective emission colors (R, G, and B) which can be applied to the first embodiment will be described below. In the following exemplary configuration, L1, L2, and L3 represent thicknesses depicted in FIG. 6 described later.

R: L1=230 nm, L2=45 nm, L3=20 nm, and L1+L2+L3=295 nm
G: L1=190 nm, L2=30 nm, L3=30 nm, and L1+L2+L3=250 nm
B: L1=140 nm, L2=30 nm, L3=30 nm, and L1+L2+L3=200 nm In this example, it is possible to suppress a loss of light flux by the multiple-interference filter and the cavity portion to a minimum level and to improve the color shift of white. Specifically, the color shift Δuv of white at a viewing angle of 60° is held to be equal to or smaller than 0.015.

On the other hand, in the example disclosed in JP-B-3508741 exemplified in the Related Art section, the color shift of white under the existence of a viewing angle is improved in the following manner. That is, the color shift of white is improved by shifting the peak wavelength of the internal emission spectrum relative to the peak wavelength of the multiple interference filter spectrum to change the luminance variation under the existence of a viewing angle to thus adjust the amount of change in the luminance balance (white balance) values.

However, in this related-art example, since the peak wavelength of the internal emission spectrum is shifted relative to the peak wavelength of the multiple interference filter spectrum, a loss of light flux increases, and thus the light extraction efficiency decreases.

Exemplary configurations of the cavity structures of organic EL devices having respective emission colors (R, G, and B) which can be applied to the related-art example will be described below.

R: L1=200 nm, L2=45 nm, L3=40 nm, and L1+L2+L3=285 nm
G: L1=180 nm, L2=30 nm, L3=55 nm, and L1+L2+L3=265 nm
G: L1=20 nm, L2=30 nm, L3=140 nm, and L1+L2+L3=190 nm In this example, although it is possible to improve the color shift of white, the light extraction efficiency decreases.

Figure 7:
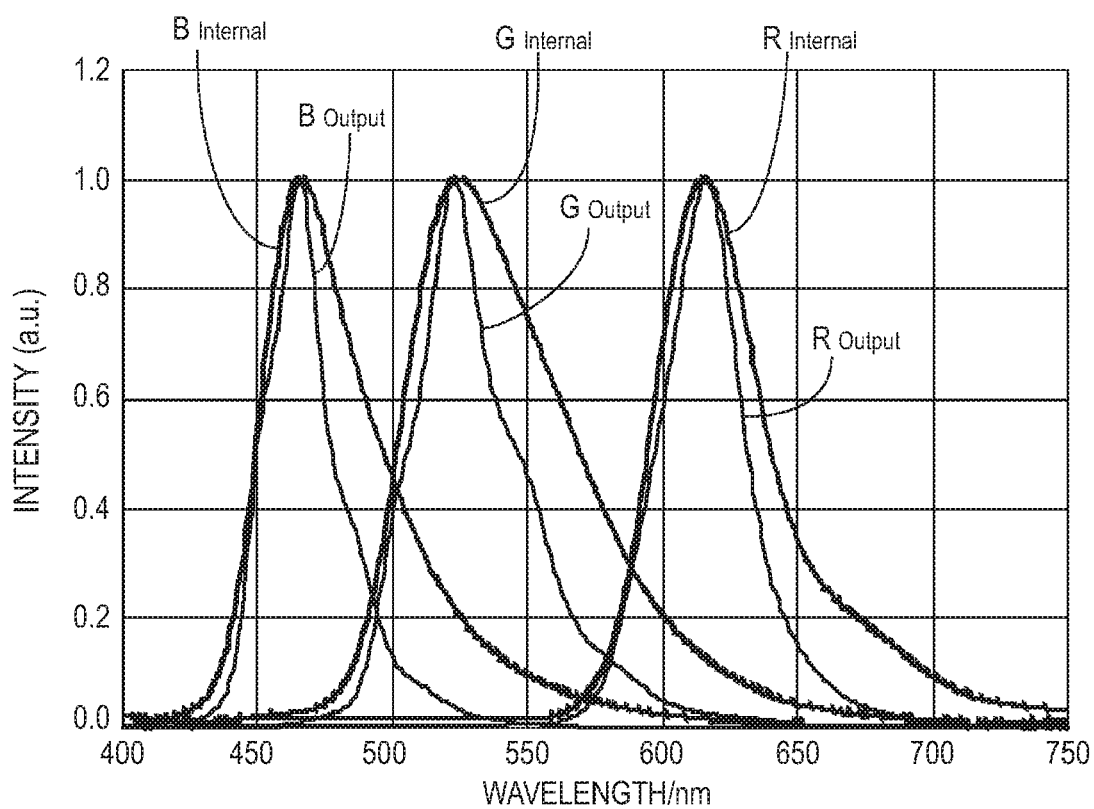
FIG. 7 is a schematic diagram showing the internal emission spectrum of a related-art structure and the spectrum of extracted light.

Specific examples of the improvement in the color shift of white will be described with reference to FIGS. 7 to 9. In the internal emission spectrum and the spectrum of extracted light as shown in FIG. 7, the position of the light emitting layer 13c of the cavity structure of green (G) is shifted by +10 nm, the position of the light emitting layer 13c of the cavity structure of red (R) is shifted by +10 nm, and the position of the light emitting layer 13c of the cavity structure of blue (B) is shifted by −10 nm.

In the above description, "+" is the upper side (i.e., the side opposite to the substrate 11), and "−" is the lower side (i.e., the side of the substrate 11). Moreover, in FIG. 7, the spectrum denoted by the subscript "Internal" corresponds to the internal emission spectrum, and the spectrum denoted by the subscript "Output" corresponds to the spectrum of the extracted light.

Figure 8:
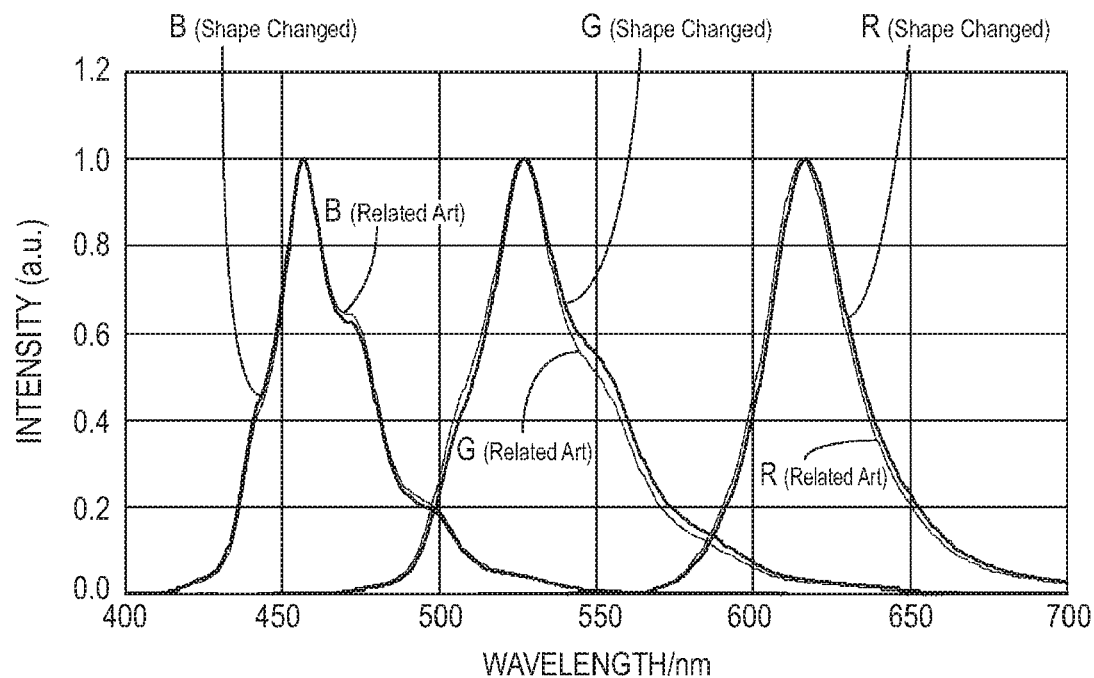
FIG. 8 is a schematic diagram showing the spectrum of light extracted by the organic EL device according to the first embodiment and the related-art structure.

As shown in FIG. 8, by shifting the position of the light emitting layer 13c as described above, the shape of the spectrum of the extracted light is changed before and after the position of the light emitting layer 13c is shifted. The spectra denoted by "R (Shape Changed)", "G (Shape Changed)", and "B (Shape Changed)" are the spectra of the extracted light after the position of the light emitting layer 13c is changed. In FIG. 8, the spectra of the extracted light denoted by "R (Related Art)", "G (Related Art)", and "B (Related Art)" correspond to the cavity structures of the related art in which the peak wavelength of the multiple interference filter spectrum obtained by the cavity portion is made to be identical to the peak wavelength of the internal emission spectrum, thus maximizing the light extraction efficiency.

Figure 9:
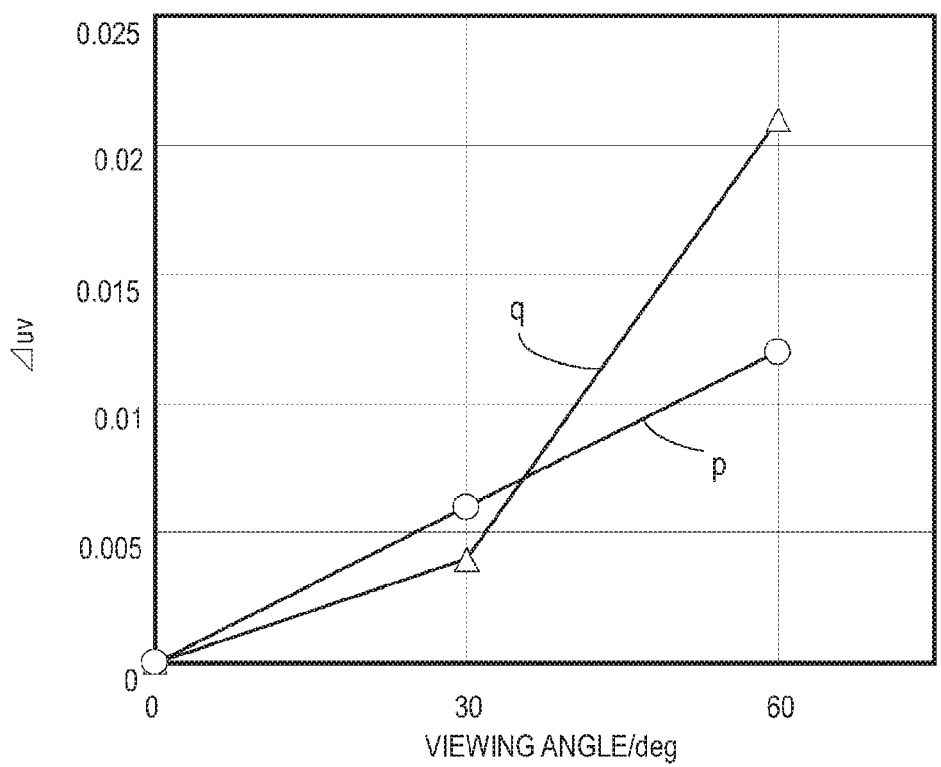
FIG. 9 is a schematic diagram showing the Δuv and viewing angle characteristics of the organic EL devices according to the first embodiment and the related art.

The color shift of white obtained in this way is shown in FIG. 9. In FIG. 9, the line denoted by "p" represents the color shift of white after the position of the light emitting layer 13c is shifted. In FIG. 9, the line denoted by "q" represents the color shift of white in the cavity structure of the related art.

As shown by the line denoted by "p", by shifting the position of the light emitting layer 13c as described above, the color shift of white was obtained as Δuv=0.06 at a viewing angle of 30° and Δuv=0.012 at a viewing angle of 60°. Thus, the color shift of white was decreased.

That is to say, the color shift of white, which shows in line q, can be decreased greatly compared to the color shift of white in the cavity structure of the related art. Since the color shift of white under the existence of a viewing angle is improved by shifting the position of the light emitting layer 13c, there is substantially no increase in necessary current resulting from the change of the light emission position.

Advantage

According to the first embodiment, the peak wavelength of the internal emission spectrum is made to be identical to the peak wavelength of the multiple interference filter spectrum obtained by the cavity portion so that the shape of the multiple interference filter spectrum obtained by the cavity portion is changed while maintaining the peak position. In this way, it is possible to adjust the RGB balance of the luminance variation and to thus decrease the viewing-angle dependency of white greatly. Moreover, excellent light extraction efficiency can be provided.

In the related art, the viewing-angle dependency of white was decreased by shifting the peak wavelength of the internal emission spectrum relative to the peak wavelength of the multiple interference filter spectrum. However, when the viewing-angle dependency of white is decreased by shifting the peak wavelength of the internal emission spectrum relative to the peak wavelength of the multiple interference filter spectrum, the light extraction efficiency will be decreased greatly.

Moreover, in the first embodiment, it is preferable to increase the transmittance of the multiple interference filter spectrum for R emission light in the longer wavelength region than the peak wavelength. Moreover, it is preferable to increase the transmittance of the multiple interference filter spectrum for B and G emission light in the shorter wavelength region than the peak wavelength. In this way, the chromaticity values of the respective colors can be adjusted to deeper colors.

2. Second Embodiment

Figure 10:
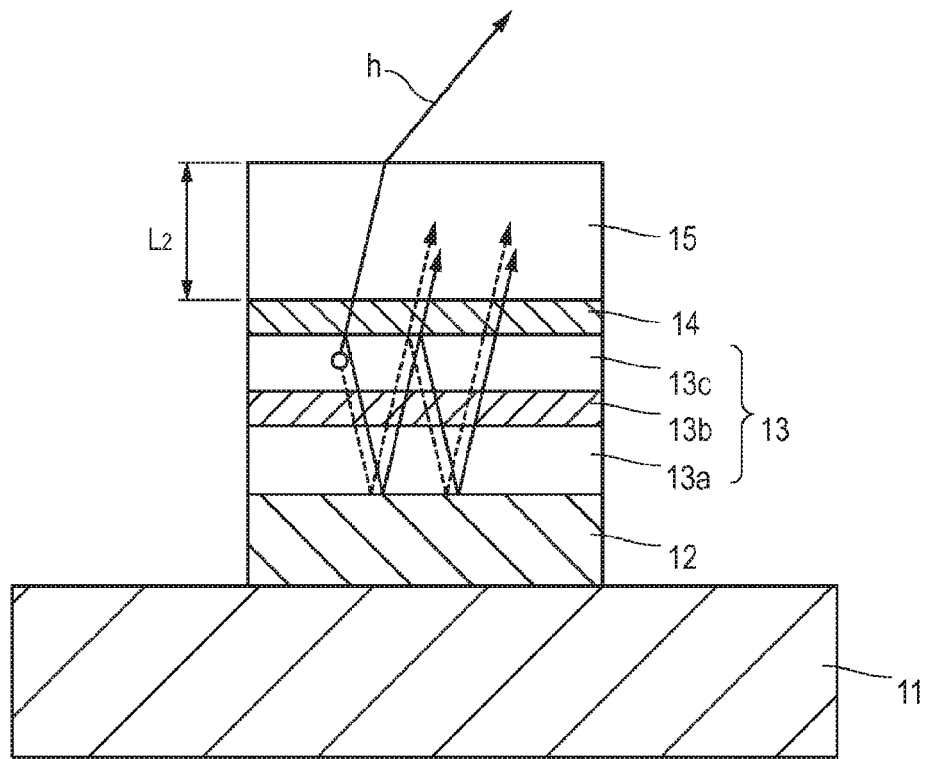
FIG. 10 is a main cross-sectional view showing an organic EL device according to a second embodiment.

An organic EL device according to the second embodiment will be described. FIG. 10 shows the organic EL device according to the second embodiment. The organic EL device shown in FIG. 10 is modified from the organic EL device according to the first embodiment shown in FIG. 1 in such a way that a cavity structure is made up of the transparent reflection layer 14, the second electrode 15, and the upper interface of the second electrode 15 (for example, the interface with the atmospheric layer). The reflectance at the interface of the end surface of the second electrode 15 and the atmospheric layer is as large as approximately 10%. In this example, the effect of the cavity having the second electrode 15 made of a transparent material as its cavity portion is used.

Therefore, the distance between the atmospheric layer and the semitransparent reflection layer 14, i.e., the optical distance of the cavity portion made up of the second electrode 15, is L (in this example, this will be denoted by L2 to be differentiated from the first embodiment).

When a passivation film made of a transparent dielectric material having a refractive index equivalent to the second electrode 15 is provided on the second electrode 15, the passivation film and the second electrode 15 function as the cavity portion. Other configurations are the same as the first embodiment, and description thereof will be omitted.

Advantage

The organic EL device according to the second embodiment can obtain the same advantages as those of the organic EL device according to the first embodiment.

3. Third Embodiment

Figure 11:
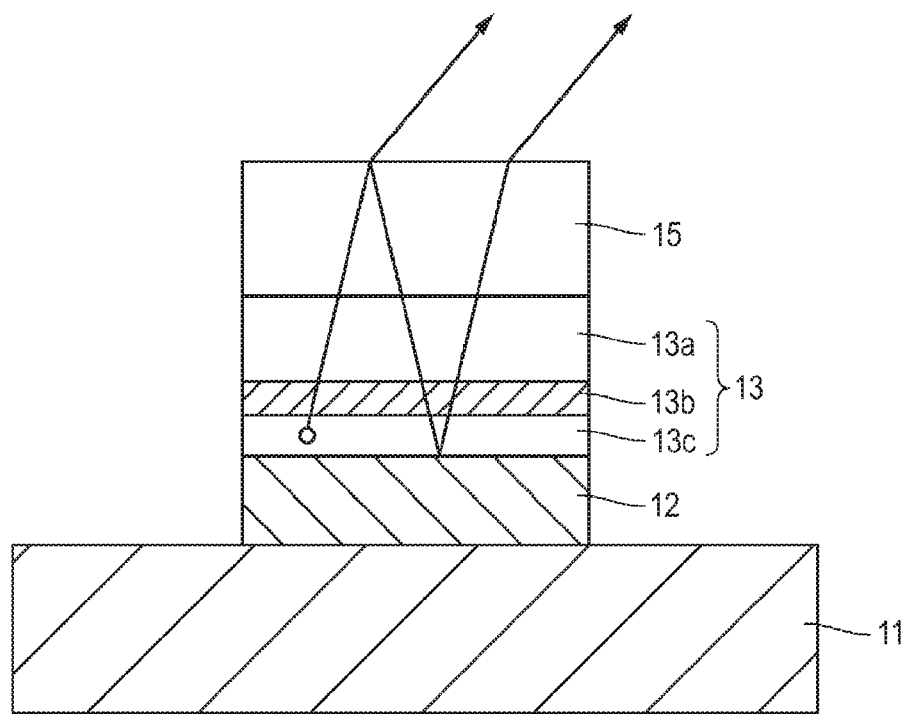
FIG. 11 is a main cross-sectional view showing an organic EL device according to a third embodiment.

FIG. 11 shows an organic EL device according to the third embodiment. The organic EL device shown in FIG. 11 has a structure in which the first electrode 12 is a cathode electrode made of a light reflective material, the second electrode 15 is an anode electrode made of a transparent electrode material, and the organic light-emitting layer 13c, the hole transport layer 13b, and the buffer layer 13a are stacked sequentially from the side of the first electrode 12. In this case, the organic layer 13 and the second electrode 15 are combined to form one cavity portion so that light generated in the organic light-emitting layer 13c is reflected at the lower end of the organic layer 13 (the interface with the first electrode 12) and the upper end of the second electrode 15 (the interface with the atmospheric layer). The optical distance between the organic layer 13 and the second electrode 15 is L.

When a passivation film made of a transparent dielectric material having a refractive index equivalent to the second electrode 15 is provided on the second electrode 15, the passivation film and the second electrode 15 function as the cavity portion. Other configurations are the same as the first embodiment, and description thereof will be omitted.

Advantage

The organic EL device according to the third embodiment can obtain the same advantages as those of the organic EL device according to the first embodiment.

4. Fourth Embodiment (Structure of Display Apparatus)

Figure 12:
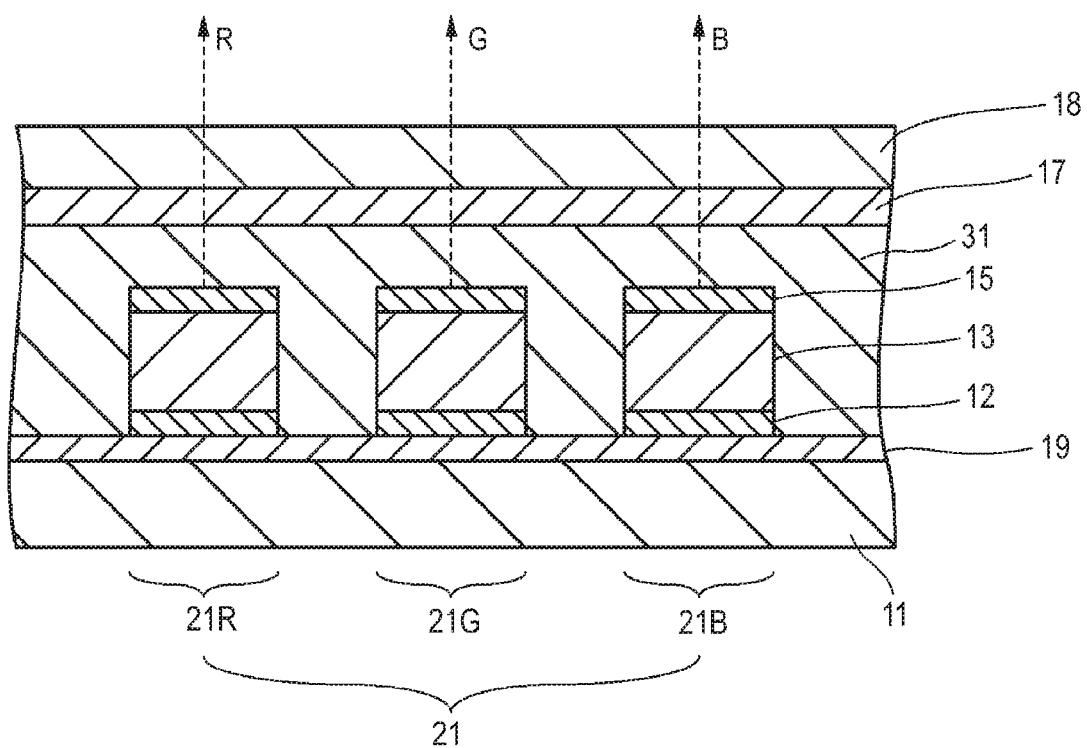
FIG. 12 is a cross-sectional view showing a display apparatus according to a fourth embodiment.

A display apparatus according to the fourth embodiment will be described. FIG. 12 shows the cross-sectional structure of the display apparatus according to the fourth embodiment. The display apparatus according to the fourth embodiment n is an active-matrix display apparatus, for example, and a so-called top emission-type display apparatus.

The display apparatus has an organic EL device 21 having a stacked structure in which at least the first electrode 12, the organic layer 13, and the second electrode 15 are sequentially stacked on the substrate 11. As this organic EL device 21, the organic EL device of one of the first to third embodiments can be used.

In the organic EL device 21, when necessary voltage-current is applied between the first electrode 12 and the organic EL device 21, holes are injected from the first electrode 12 to the light emitting layer 13c and electrons are injected from the second electrode 15 to the light emitting layer 13c, whereby hole-electron recombination takes place in the light emitting layer 13c, and light is emitted from the light emitting layer 13c. Since the structure of the organic EL device 21 has been described above, detailed description thereof will be omitted.

A passivation film 31 is provided on the second electrode 15. An adhesive layer 17 such as a heat curable resin or ionizing radiation curable resin such as an ultraviolet curable resin is provided on the passivation film 31. A sealing substrate 18 made of glass or the like is bonded to the entire surface of the adhesive layer 17, whereby the organic EL device 21 is sealed. A plurality of organic EL devices 21 is disposed in a matrix form on a TFT layer 19 which is formed on the substrate 11.

On the TFT layer 17, thin-film transistors (TFTs) are disposed so as to drive the organic EL devices 21. The thin-film transistors are formed, for example, by repeating plasma CVD-based film-formation and photolithographic pattern formation.

One pixel of the display apparatus is made up of the three subpixels of R subpixel, G subpixel, and B subpixel. An organic EL device 21R, an organic EL device 21B, and an organic EL device 21G each form one subpixel. The organic EL device 21R emits red light R and forms the R subpixel. The organic EL device 21G emits green light G and forms the G subpixel. The organic EL device 21B emits blue light B and forms the B subpixel. The respective organic EL devices 21 are connected to thin-film transistors and the On/Off of the light emission thereof is controlled.

Advantage

In the display apparatus according to the fourth embodiment, it is possible to decrease the viewing-angle dependency of white greatly. Moreover, excellent light extraction efficiency can be provided.

5. Other Embodiments (Modifications)

While specific embodiments of the present application have been described in detail, the present application is not limited to those embodiments described above, but various changes and modifications may be effected therein based on the technical spirit of the application.

For example, numerical values, structures, shapes, materials, etc. shown in the foregoing embodiments are not but mere examples, and other appropriate numerical values, structures, shapes, materials, and so forth, can be used.

For example, in the first embodiment, the anode electrode is configured by the first electrode 12 which is formed of a metal film having a high work function. However, the anode electrode may be configured by a two-layered structure in which a transparent conductive film is layered on a reflection film such as a dielectric multi-layered film made of aluminum (Al). In this case, the reflection film functions as the first electrode in the embodiment. The transparent conductive film forms a part of the cavity portion.

Moreover, in the third embodiment, a semitransparent reflection layer (not shown) made of a material having a high work function, such as Pt, Au or Cr, may be provided between the organic layer 13 and the second electrode 15. In this case, the structure of the cavity portion is the same as those of the first and second embodiments.

Furthermore, the first to third embodiments have been described for the case where the present application is applied to the top emission-type organic EL device. However, the present application is also applicable to a transmissive organic EL device using the transparent substrate 11. Moreover, the present application is also applicable to an organic EL device connected to a thin-film transistor on the substrate 11.

Moreover, an organic EL device may be configured by combining the first to third embodiments as necessary. For example, the second embodiment may be combined with the first embodiment to form an organic EL device.

The configuration of the cavity portion described in the second embodiment is also applicable to a cavity portion made up of the organic layer 13. However, the cavity portion described in the second embodiment is suitable for a configuration in which the cavity portion is configured by the second electrode 15 having a relatively high degree of freedom in the direction of increasing its thickness considering the cavity portion described in the second embodiment results in a relatively large thickness. Moreover, the configuration of the cavity portion described in the first embodiment is also applicable to a cavity portion which is configured by the second electrode 15 (and the passivation film disposed thereabove).

Furthermore, the integer term m in Equation 3 preferably has the same value for the respective RGB colors since the respective colors exhibit similar change in the viewing angle characteristics. However, by using the present application, the integer term may have a combination of other integer values such as (0, 1) or (1, 2).

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A display device comprising:
an optical cavity portion; and
a light emitting layer,
wherein a peak wavelength of an internal emission spectrum of the light emitting layer is identical to a peak wavelength of a multiple interference filter spectrum of the optical cavity portion, and
wherein a color shift $\Delta$ uv of white light in the display device at a viewing angle of 60° is less than or equal to 0.015.

2. A display device according to claim 1, further comprising:
a first electrode;
a second electrode; and
an organic layer provided between the first and second electrodes, the organic layer including the light emitting layer,
wherein at least one of the organic layer, the first electrode and the second electrode functions as the optical cavity portion.

3. A display device according to claim 2, further comprising a semitransparent reflection layer provided between the organic layer and the second electrode, wherein the first electrode, the organic layer and the semitransparent reflection layer form an optical cavity structure and the organic layer functions as the optical cavity portion.

4. A display device according to claim 2, further comprising a semitransparent reflection layer provided between the organic layer and the second electrode, wherein the semitransparent reflection layer, the second electrode and an upper interface of the second electrode form an optical cavity structure and the second electrode functions as the optical cavity portion.

5. A display device according to claim 2, wherein the organic layer and the second electrode function as the optical cavity portion.

6. A display device according to claim 1, wherein the organic layer comprises a buffer layer, a hole transport layer and the light emitting layer.

7. A display device according to claim 6, wherein the organic layer further comprises an electron transport layer.

8. A display device according to claim 1, wherein the light emitting layer includes a light emitting material having an emission color selected from the group consisting of red, green and blue.

9. A display device according to claim 1, wherein the color shift $\Delta$ uv of white light in the display device at a viewing angle of 60° is less than or equal to 0.012.

10. A display device according to claim 9, wherein the color shift $\Delta$ uv of white light in the display device at a viewing angle of 30° is less than or equal to 0.06.

11. A display device comprising:
an optical cavity portion; and
a light emitting layer,
wherein a peak wavelength of an internal emission spectrum of the light emitting layer is identical to a peak wavelength of a multiple interference filter spectrum of the optical cavity portion, and
wherein a color shift $\Delta$ uv of white light in the display device at a viewing angle of 60° is less than or equal to 0.015 based on a position of the light emitting layer in a thickness direction thereof.

12. A display device according to claim 11, further comprising:
a first electrode;
a second electrode; and
an organic layer provided between the first and second electrodes, the organic layer including the light emitting layer,
wherein at least one of the organic layer, the first electrode and the second electrode functions as the optical cavity portion.

13. A display device according to claim 12, further comprising a semitransparent reflection layer provided between the organic layer and the second electrode, wherein the first electrode, the organic layer and the semitransparent reflection layer form an optical cavity structure and the organic layer functions as the optical cavity portion.

14. A display device according to claim 12, further comprising a semitransparent reflection layer provided between the organic layer and the second electrode, wherein the semitransparent reflection layer, the second electrode and an upper interface of the second electrode form an optical cavity structure and the second electrode functions as the optical cavity portion.

15. A display device according to claim 12, wherein the organic layer and the second electrode function as the optical cavity portion.

16. A display device according to claim 11, wherein the organic layer comprises a buffer layer, a hole transport layer and the light emitting layer.

17. A display device according to claim 16, wherein the organic layer further comprises an electron transport layer.

18. A display device according to claim 11, wherein the light emitting layer includes a light emitting material having an emission color selected from the group consisting of red, green and blue.

19. A display apparatus comprising:
an optical cavity portion; and
a light emitting layer,
wherein a peak wavelength of an internal emission spectrum of the light emitting layer is identical to a peak wavelength of a multiple interference filter spectrum of the optical cavity portion, and
wherein a color shift $\Delta$ uv of white light in the display device at a viewing angle of 60° is less than or equal to 0.015.

20. A display apparatus according to claim 19, further comprising a red subpixel, a green subpixel and a blue subpixel.

21. A display apparatus comprising:
an optical cavity portion; and
a light emitting layer,
wherein a peak wavelength of an internal emission spectrum of the light emitting layer is identical to a peak wavelength of a multiple interference filter spectrum of the optical cavity portion, and
wherein a color shift $\Delta$ uv of white light in the display device at a viewing angle of 60° is less than or equal to 0.015 based on a position of the light emitting layer in a thickness direction thereof.

22. A display apparatus according to claim 21, further comprising a red subpixel, a green subpixel and a blue subpixel.

* * * * *